United States Patent
Kawagoe et al.

(10) Patent No.: US 7,652,912 B2
(45) Date of Patent: Jan. 26, 2010

(54) NONVOLATILE SEMICONDUCTOR MEMORY DEVICE PERFORMING DATA WRITING IN A TOGGLE MANNER

(75) Inventors: Tomoya Kawagoe, Tokyo (JP); Jun Otani, Tokyo (JP); Hideto Hidaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 694 days.

(21) Appl. No.: 11/520,563

(22) Filed: Sep. 14, 2006

(65) Prior Publication Data

US 2007/0064472 A1    Mar. 22, 2007

(30) Foreign Application Priority Data

Sep. 22, 2005    (JP)    ............... 2005-276478

(51) Int. Cl.
*G11C 11/00*    (2006.01)
(52) U.S. Cl. .................. 365/158; 365/148; 365/173
(58) Field of Classification Search ............ 365/158, 365/148, 173
See application file for complete search history.

(56) References Cited

U.S. PATENT DOCUMENTS

| 5,695,864 | A | 12/1997 | Slonezewski |
| 6,545,906 | B1 | 4/2003 | Savtchenko et al. |
| 6,903,963 | B2 * | 6/2005 | Hidaka .................. 365/158 |
| 2007/0268737 | A1 * | 11/2007 | Hidaka .................. 365/148 |
| 2009/0244959 | A1 * | 10/2009 | Hidaka .................. 365/158 |

FOREIGN PATENT DOCUMENTS

| JP | 2003-017782 | 1/2003 |
| JP | 2004-179483 | 6/2004 |

OTHER PUBLICATIONS

Thomas W. Andre et al., "IEEE Journal of Solid-State Circuits", vol. 40, No. 1, Jan. 2005, pp. 301-309.

* cited by examiner

*Primary Examiner*—Tuan T. Nguyen
(74) *Attorney, Agent, or Firm*—McDermott Will & Emery LLP

(57) ABSTRACT

A nonvolatile semiconductor memory device includes a free layer having first and second magnetic layers magnetized oppositely to each other, and also having a first nonmagnetic layer formed between the first and second magnetic layers, a first fixed layer having a fixed magnetization direction, a second nonmagnetic layer formed between the second magnetic layer and the first fixed layer, a first drive circuit passing a write current through a first write current line in a data write operation, and thereby generating a data write magnetic field acting on magnetization of the free layer, and a second drive circuit passing a spin injection current between the first magnetic layer and the first fixed layer in a data write operation, and thereby exerting a force in the same direction as or in the direction opposite to the magnetization direction of the first fixed layer on the magnetization of the free layer.

9 Claims, 10 Drawing Sheets

NONVOLATILE SEMICONDUCTOR MEMORY DEVICE PERFORMING DATA WRITING IN A TOGGLE MANNER

BACKGROUND OF THE INVENTION

1. Field of the Invention

The present invention relates to a nonvolatile semiconductor memory device, and particularly to a nonvolatile semiconductor memory device performing data writing in a toggle manner.

2. Description of the Background Art

An MRAM (thin film Magnetic Random Access Memory) is a general name of solid state memories that utilize a magnetization direction of a ferromagnet for data storage. In the MRAM, the magnetization direction of the ferromagnetic substance forming a memory cell is set parallel and anti-parallel to a certain reference direction in accordance with data "1" and "0", respectively. A GMR (Giant Magneto-Resistance) element utilizing a GMR effect for reading data of the memory cell, a TMR (Tunneling Magneto-Resistance) element utilizing a tunneling magneto-resistance effect for reading the data and the like are used as the MRAMs.

The TMR element is formed of three layer films of ferromagnetic, insulating and ferromagnetic layers, and a tunneling current flows through the insulating layer. A resistance value with respect to this tunneling current changes in accordance with a relationship in magnetization direction between the ferromagnetic layers.

An external magnetization inverting method has been known as a method of inverting the magnetization direction of the ferromagnetic layer. In this external magnetization inverting method, an external magnetic field is generated by passing a current through the vicinity of the memory cells, and thereby the magnetization direction of the ferromagnetic layer is inverted. In this external magnetization inverting method, however, the external magnetic field affects magnetization of a memory cell other than a write-target memory cell, and particularly the memory cell that is located one at least one of a bit line and a digit line corresponding to the write-target memory cells (and may also be referred to as a "half-selected memory cell" hereinafter). Thereby, the external magnetic field may cause a malfunction.

For overcoming the above problem, a toggle manner has been known as a manner of writing data into the memory cell. In the toggle manner, the TMR element is formed of a fixed magnetic layer that is a ferromagnetic layer having a fixed magnetization direction, a free magnetic layer that is a ferromagnetic layer having a variable magnetization direction and an insulating layer. The free magnetic layer in the toggle manner has an SAF (Synthetic Anti-Ferromagnetic coupling) structure. Thus, the free magnetic layer includes a pair of ferromagnetic layers magnetized oppositely to each other, and a nonmagnetic layer formed between the paired ferromagnetic layers. For changing the direction of magnetization of the free magnetic layer, currents are passed through the bit line and the digit line to generate two magnetic fields. The current is passed through the bit line according to timing shifted from that of current passing through the digit line, whereby turning of the magnetization of the pair of ferromagnetic layers follows the direction of the composite magnetization vector produced by the two magnetic fields, and thereby the magnetization inversion or toggling or occurs. In the toggle manner, the magnetic field alone produced by the current flowing through one of the lines cannot cause the magnetization inversion or toggling. Therefore, it is possible to prevent a malfunction that may occur when a magnetic field affects magnetization of a half-selected memory cell (see, e.g., U.S. Pat. No. 6,545,906 and "IEEE JOURNAL OF SOLID-STATE CIRCUITS", Vol. 40, No. 1, January 2005).

A spin injection magnetization inverting method has been known as a method of inverting a magnetization direction of a ferromagnetic substance (e.g., see U.S. Pat. No. 5,695,864). In this method, a direct current is passed through a memory cell, and thereby the magnetization is inverted by an operation of spin (direction) of electrons. More specifically, a current (which will be referred to as a "spin injection current" hereinafter) is passed from one of ferromagnetic layers of a TMR element to the other ferromagnetic layer, and thereby the magnetization of the ferromagnetic layers is inverted. Since the spin injection current can be smaller in quantity than the current causing the external magnetic field, the spin injection magnetization inverting method can reduce current consumption of the MRAM as compared with the external magnetization inverting method.

As a nonvolatile magnetic memory employing this spin injection magnetization inverting method, the following nonvolatile magnetic memory has been disclosed, e.g., in Japanese Patent Laying-Open No. 2003-017782. In this memory, an insulating layer is arranged over a fixed magnetization layer, and a magnetization inverting layer having carrier-induced magnetic properties is arranged over the insulating layer. In this magnetization inverting layer, a direction of magnetization is inverted by injection of carrier spin. An electrode injecting the carrier spin into the magnetization inverting layer is arranged on the magnetization inverting layer.

As a nonvolatile magnetic memory employing the spin injection magnetization inverting method, Japanese Patent Laying-Open No. 2004-179483 has disclosed the following nonvolatile magnetic memory. In this memory, an MIS (Metal Insulator Semiconductor) junction laminated film is formed of a diode, a spin injection magnetization inversion induced layer and a tunneling magnetic resistance effect element, and bit and word lines are connected to this laminated film.

It is necessary to generate a strong magnetic field for changing the direction of magnetization of a ferromagnetic layer, and it is necessary to increase a quantity of current passed through a line for generating the strong magnetic field. Therefore, in the toggle manners disclosed in U.S. Pat. No. 6,545,906 and "IEEE JOURNAL OF SOLID-STATE CIRCUITS", i.e., in the toggle manners requiring generation of two magnetic fields for changing the direction of magnetization, large quantities of currents flow through the bit and digit lines, which results in a problem that the current consumption for data writing is large.

SUMMARY OF THE INVENTION

An object of the invention is to provide a nonvolatile semiconductor memory device that can reduce current consumption for data writing in a toggle manner.

A nonvolatile semiconductor memory device according to an aspect of the invention includes a magnetic storing portion having an electric resistance value variable depending on storage data. The magnetic storing portion includes a free magnetic layer having first and second magnetic layers magnetized oppositely to each other, and also having a first nonmagnetic layer formed between the first and second magnetic layers, a first fixed magnetic layer having a fixed magnetization direction, a second nonmagnetic layer formed between the second magnetic layer and the first fixed magnetic layer. The nonvolatile semiconductor memory device further includes a first drive circuit passing a write current through a first write current line in a data write operation, and thereby generating a data write magnetic field acting on magnetization of the free magnetic layer, and a second drive circuit passing a spin injection current between the first magnetic layer and the first fixed magnetic layer of the magnetic storing portion in a data write operation, and thereby exerting a force in the same direction as or in the direction opposite to the magnetization direction of the first fixed magnetic layer on the magnetization of the free magnetic layer.

The invention can reduce the current consumption during data writing in the toggle manner.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
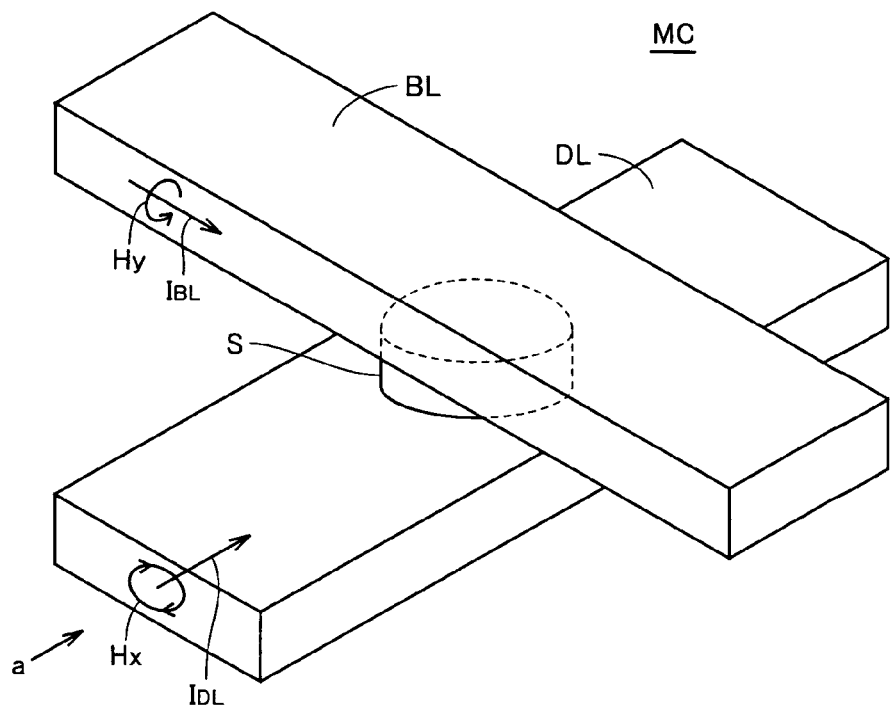
FIG. 1 a perspective view showing a part of a memory cell in a nonvolatile semiconductor memory device according to a first embodiment of the invention.

Embodiments of the invention will now be described with reference to the drawings. In the drawings, the same or corresponding portions bear the same reference numbers, and description thereof is not repeated.

First Embodiment

FIG. 1 is a perspective view of a part of a memory cell MC of a nonvolatile semiconductor memory device according to a first embodiment of the invention.

A magnetic storing portion S is, e.g., a TMR element, and is arranged at a crossing point between a digit line DL and a bit line BL.

When a digit line current (write current) IDL flows through digit line (first write current line) DL, this generates a magnetic field (data write magnetic field) Hx turning clockwise around the center through which digit line current IDL flows. When a bit line current IBL flows through bit line BL, it generates a magnetic field Hy turning clockwise around the center through which bit line current IBL flows. Digit line DL and bit line BL are substantially perpendicular to each other. Therefore, magnetic fields Hx and Hy are substantially perpendicular to each other. In this nonvolatile semiconductor memory device, the magnetization direction of magnetic storing portion S depends on action or operation of magnetic field Hx and a magnetic torque generated by a spin injection current to be described later, and thereby the data writing is performed.

In the data read operation, data is detected based on a current quantity of a tunnel current (read current) flowing through magnetic storing portion S. The memory cell including such magnetic storing portion S has "magnet-tunneling junction" formed therein, and therefore is referred to as an "MTJ memory cell".

Figure 2:
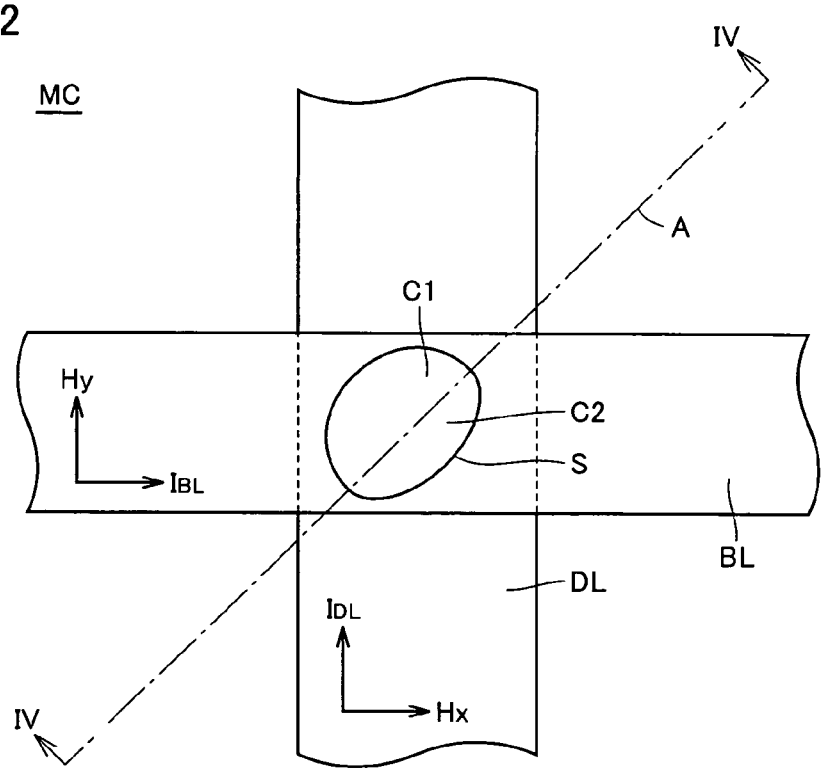
FIG. 2 is a top view of memory cell MC in FIG. 1.

FIG. 2 is a top view of memory cell MC in FIG. 1.

Referring to FIG. 2, magnetic storing portion S has a form defined by a combination of two semi-elliptic regions C1 and C2 having different radial sizes. An easy axis A is formed in the same direction as the long axis of the ellipse.

Bit lines BL and digit lines DL are arranged in a grid-like fashion, and form an angle of about 90° between them. Magnetic storing portion S is arranged at the crossing point between the digit and bit lines DL and BL in such a state that easy axis A forms an inclination angle θ (0°<θ<90°) that is equal to 45° in FIG. 2 with respect to digit line DL.

When digit line current IDL flows in a direction shown in FIG. 2, rightward magnetic field Hx occurs with respect to magnetic storing portion S. When bit line current IBL flows in a direction shown in FIG. 2, upward magnetic field Hy occurs with respect to magnetic storing portion S. In the nonvolatile semiconductor memory device according to the first embodiment of the invention, however, magnetic field Hy generated by bit line current IBL is not used for the data writing, and the data writing is performed by the operation of magnetic field Hx and the magnetic torque generated by the spin injection current which will be described later.

Figure 3A:
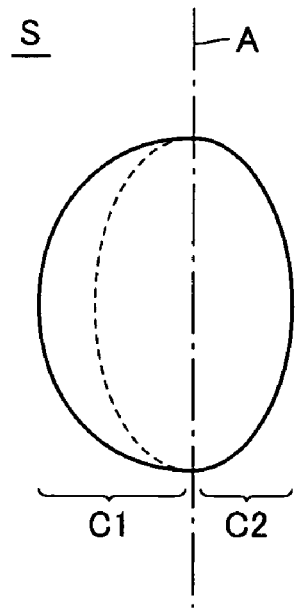
FIG. 3A shows a form of a magnetic storing portion S in FIG. 2.

FIG. 3A shows a form of magnetic storing portion S in FIG. 2.

Referring to FIG. 3A, two regions C1 and C2 of magnetic storing portion S cut by easy axis A have different degrees of magnetization turn easiness, respectively. More specifically, since region C1 has a radial size longer than that of region C2 in magnetic storing portion S, the degree of magnetization turn easiness of region C1 is higher than that of region C2.

Figure 3B:
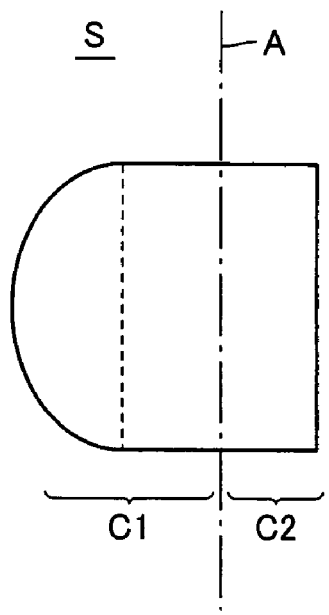
FIG. 3B shows another example of the form of magnetic storing portion S.

FIG. 3B shows another example of the form of magnetic storing portion S.

Referring to FIG. 3B, magnetic storing portion S has a form defined by cutting a rectangle by easy axis A, and combining one of the cut regions with a semi-ellipse having an axis parallel to easy axis A. Similarly to FIG. 3A, since region C1 has a loner radial size than region C2 in magnetic storing portion S, the degree of magnetization turn easiness of region C1 is higher than that of region C2.

The forms of regions C1 and C2 are not restricted to those having different radial directions, and regions C1 and C2 may have various forms provided that these have different degrees of magnetization turn easiness, respectively.

Figure 4:
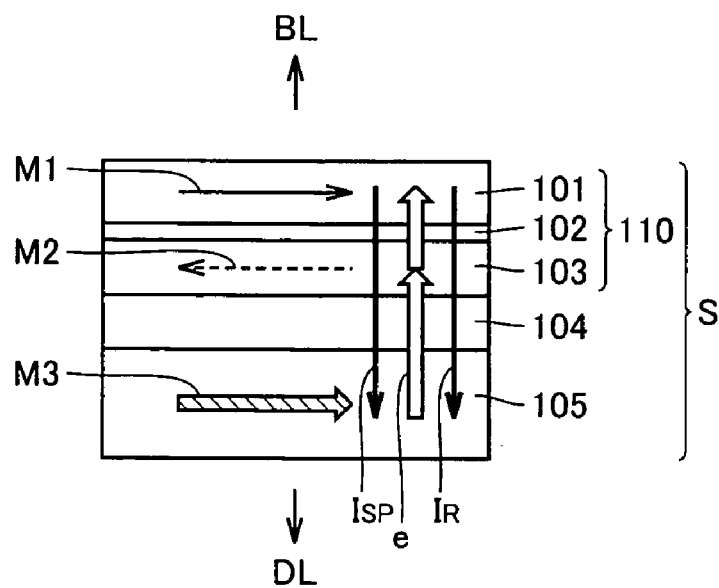
FIG. 4 is a cross section of magnetic storing portion S taken along line IV-IV in FIG. 2.

FIG. 4 is a cross section of magnetic storing portion S taken along line IV-IV in FIG. 2.

Magnetic storing portion S includes a free magnetic layer 110, a tunneling layer (second nonmagnetic layer) 104 that is an insulating layer and a fixed magnetic layer (first fixed magnetic layer) 105. Free layer 110 includes a magnetic layer (first magnetic layer) 101, a nonmagnetic layer (first nonmagnetic layer) 102 and a magnetic layer (second magnetic layer) 103.

Magnetic layers 101 and 103 are stacked with nonmagnetic layer 102 therebetween, and are configured to achieve anti-ferromagnetic coupling. More specifically, a film thickness of nonmagnetic layer 102 is appropriately determined such that free magnetic layer 110 can be stable in a normal state when magnetization M1 of magnetic layer 101 is substantially anti-parallel (180 degrees opposite) to magnetization M2 of magnetic layer 103. Magnetic layers 101 and 103 are configured such that the directions of magnetizations M1 and M2 can readily turn.

Tunneling layer 104 is formed between fixed and free magnetic layers 105 and 110. Tunneling layer 104 cuts off magnetic coupling between upper magnetic layer 103 and lower fixed magnetic layer 105, and a read current (tunnel current) IR flows therethrough. As described above, the TMR element is formed of fixed magnetic layer 105 having a fixed magnetization direction, tunneling layer 104 and a free magnetic layer 110 having a variable magnetization direction.

A bit line drive circuit 4 which will be described later passes a spin injection current Isp from magnetic layer 101 to fixed magnetic layer 105 in a data write operation. Thereby, electrons e in fixed magnetic layer 105 flow into free magnetic layer 110, and the operation of spin of these electrons e causes a force in the same direction as the magnetization direction of fixed magnetic layer 105. This force (which may also be referred to as a "magnetic torque" hereinafter) acts on magnetization M1 of magnetic layer 101 and magnetization M2 of magnetic layer 103. The magnetic torque generated by spin injection current Isp and magnetic field Hx generated by digit line current IDL invert the magnetization directions of magnetic layers 101 and 103, and thereby change the logical level of data stored in magnetic storing portion S. Thus, the magnetization direction of magnetic layer 103 with respect to fixed magnetic layer 105 is inverted to change the logical level of data stored in magnetic storing portion S.

When the magnetization direction of magnetic layer 103 in free magnetic layer 110 is the same as that of fixed magnetic layer 105, magnetic storing portion S has a small electric resistance value. When the magnetization direction of magnetic layer 103 is anti-parallel, i.e., opposite to that of fixed magnetic layer 105, magnetic storing portion S has a large electric resistance value. The data recorded in magnetic storing portion S can be read by passing a read current IR from magnetic layer 101 to fixed magnetic layer 105, and detecting a difference in current quantity of read current IR caused by a difference in electric resistance value of magnetic storing portion S.

Figure 5:
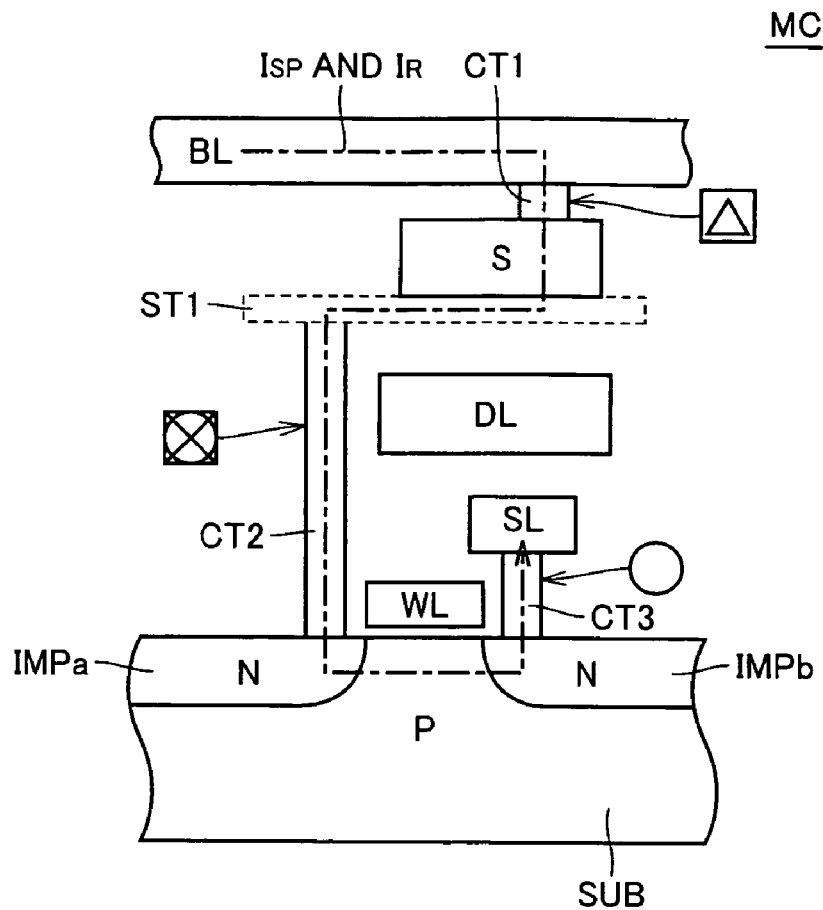
FIG. 5 schematically shows a whole structure of memory cell MC viewed in a direction a in FIG. 1.

FIG. 5 schematically shows a whole structure of memory cell MC viewed in a direction a in FIG. 1.

Referring to FIG. 5, a contact CT1 electrically connects bit line BL and magnetic storing portion S. Magnetic storing portion S is arranged between contact CT1 and a strap ST1. Strap ST1 is made of, e.g., tantalum. Strap ST1 is formed of a conductive layer, and is electrically connected via a contact CT2 to an N-type impurity region IMPa formed at a surface of a P-type substrate region SUB. An N-type impurity region IMPb spaced from impurity region IMPa is formed at the surface of substrate region SUB. A word line WL is formed on the surface of substrate region SUB, and is located between impurity regions IMPa and IMPb. Impurity region IMPb is coupled via a contact CT3 to a source line SL. Digit line DL is arranged between source line SL and strap ST1.

In the data write operation, word line WL is set (driven) to the selected state, and a channel is formed at the surface of substrate region SUB to connect electrically impurity regions IMPa and IMPb. Then, spin injection current Isp is fed from bit line BL to source line SL.

In a data read operation, word line WL is set (driven) to the selected state, and the channel is formed at the surface of substrate region SUB to connect electrically impurity regions IMPa and IMPb. Then, read current IR is fed from bit line BL to source line SL.

Figure 6:
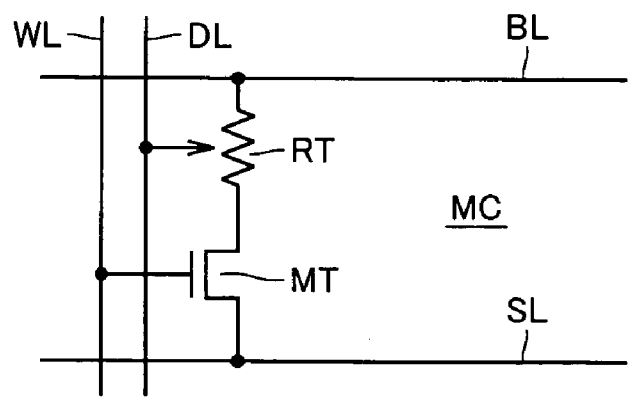
FIG. 6 shows an electrically equivalent circuit of memory cell MC.

FIG. 6 shows an electrically equivalent circuit of memory cell MC. Referring to FIG. 6, memory cell MC includes a variable resistance element (TMR element) RT and an N-channel MOS transistor (access transistor) MT that are connected in series between bit line BL and source line SL. Variable resistance element RT corresponds to magnetic storing portion S, is magnetically coupled to digit line DL and is electrically connected at one of its ends to bit line BL. Access transistor MT has conductive terminals that are electrically connected to the other end of variable resistance element RT and source line SL, respectively, and has a control gate electrically connected to word line WL.

In the data write operation, access transistor MT is turned on to pass spin injection current Isp from bit line BL to source line SL. The magnetic torque generated by spin injection current Isp and magnetic field Hx generated by digit line current IDL change the magnetization state of variable resistance element RT, and thus inverts the magnetization direction of magnetic layer 103 with respect to fixed magnetic layer 105. The resistance value of variable resistance element RT depends on the magnetization state of variable resistance element RT.

In the data read operation, access transistor MT is turned on, and the data stored in magnetic storing portion S is detected based on the current quantity of read current IR flowing through bit line BL and source line SL.

Figure 7:
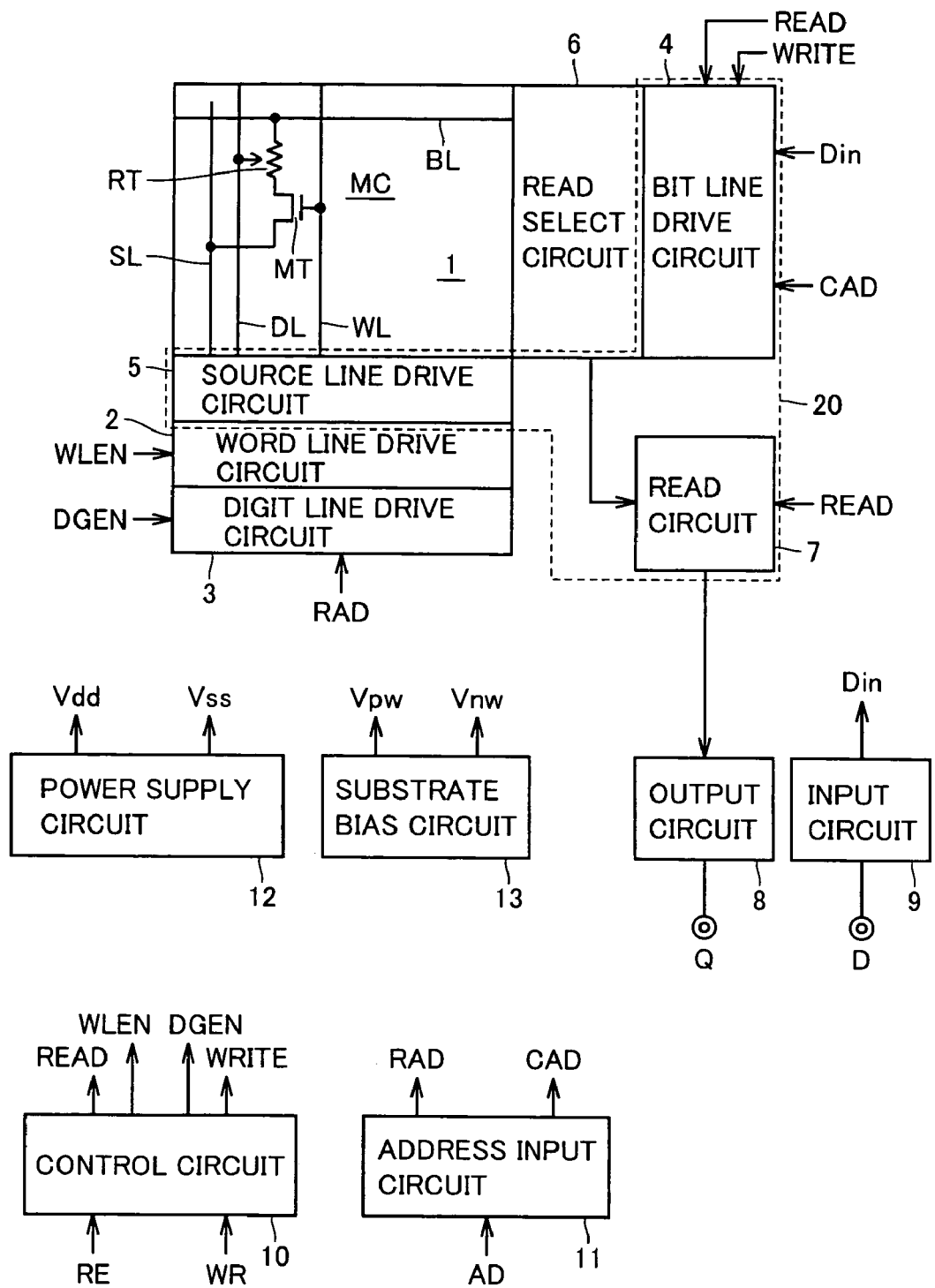
FIG. 7 schematically shows a whole structure of the nonvolatile semiconductor memory device according to the first embodiment of the invention.

FIG. 7 shows a whole structure of a nonvolatile semiconductor memory device according to the first embodiment of the invention. In the following description, the direction of extension of word line WL and digit line DL will be referred to as a "column direction", and the direction of extension of bit line BL will be referred to as a "row direction".

Referring to FIG. 7, this nonvolatile semiconductor memory device includes a memory cell array 1 having memory cells MC arranged in rows and columns, a word line drive circuit 2, a digit line drive circuit (first drive circuit) 3, bit line drive circuit 4, a source line drive circuit 5, a read select circuit 6, a read circuit 7, an output circuit 8, an input circuit 9, a control circuit 10, an address input circuit 11, a power supply circuit 12 and a substrate bias circuit 13. Bit line drive circuit 4, source line drive circuit 5 and read circuit 7 form a second drive circuit 20.

As already described with reference to FIG. 6, memory cell MC includes variable resistance element RT of which electric resistance value varies according to the storage data, and also includes access transistor MT that connects variable resistance element RT to source line SL based on a voltage applied onto word line WL.

Word line WL, source line SL and digit line DL are arranged corresponding to each column of memory cells MC, and bit line BL is arranged corresponding to each row of memory cells MC.

Word line drive circuit 2 includes a word line driver driving word line WL. Digit line drive circuit 3 includes a digit line driver driving digit line DL. Bit line drive circuit 4 includes a bit line driver driving bit line BL.

In the data write operation, input circuit 9 produces internal write data Din based on externally supplied data D. Address input circuit 11 produces an internal column address signal RAD and an internal row address signal CAD representing memory cell MC of a write target or a read target based on an externally applied address signal AD.

Control circuit 10 produces control signals required for data writing and reading based on a write control signal WR and a read control signal RE that are applied externally. For example, control circuit 10 produces a read activating signal READ, a write activating signal WRITE, a word line activating signal WLEN and a digit line activating signal DGEN.

Word line drive circuit 2 receives word line activating signal WLEN, and drives word line WL corresponding to the column indicated by internal column address signal RAD to the selected state. Word line activating signal WLEN is provided from control circuit 10 in the data write operation and data read operation.

Digit line drive circuit 3 receives digit line activating signal DGEN, and drives digit line DL corresponding to the column indicated by internal column address signal RAD to the selected state to pass digit line current IDL therethrough.

Source line drive circuit 5 drives source line SL corresponding to word line WL of memory cell MC of the write or read target to the ground voltage level.

In the data write operation, bit line drive circuit 4 receives internal row address signal CAD, internal write data Din and write activating signal WRITE, and selects bit line BL corresponding to the row indicated by internal row address signal CAD. Bit line drive circuit 4 drives selected bit line BL to the selected state to pass spin injection current Isp therethrough.

In the data read operation, bit line drive circuit 4 receives internal row address signal CAD and read activating signal READ, and sets its output to the high impedance state.

In the data read operation, read select circuit 6 selects bit line BL corresponding to the row indicated by internal row address signal CAD. Read circuit 7 receives read activating signal READ, and supplies read current IR via read select circuit 6 to bit line BL corresponding to the row indicated by internal row address signal CAD.

Read circuit 7 detects a current quantity of read current IR flowing through bit line BL selected by read select circuit 6, and thereby produces the internal read data. Output circuit 8 produces external output data Q based on the internal read data provided from read circuit 7.

Power supply circuit 12 supplies power supply voltages Vdd and Vss to each circuit. Substrate bias circuit 13 supplies bias voltages Vpw and Vnw to substrate region SUB.

Figure 8:
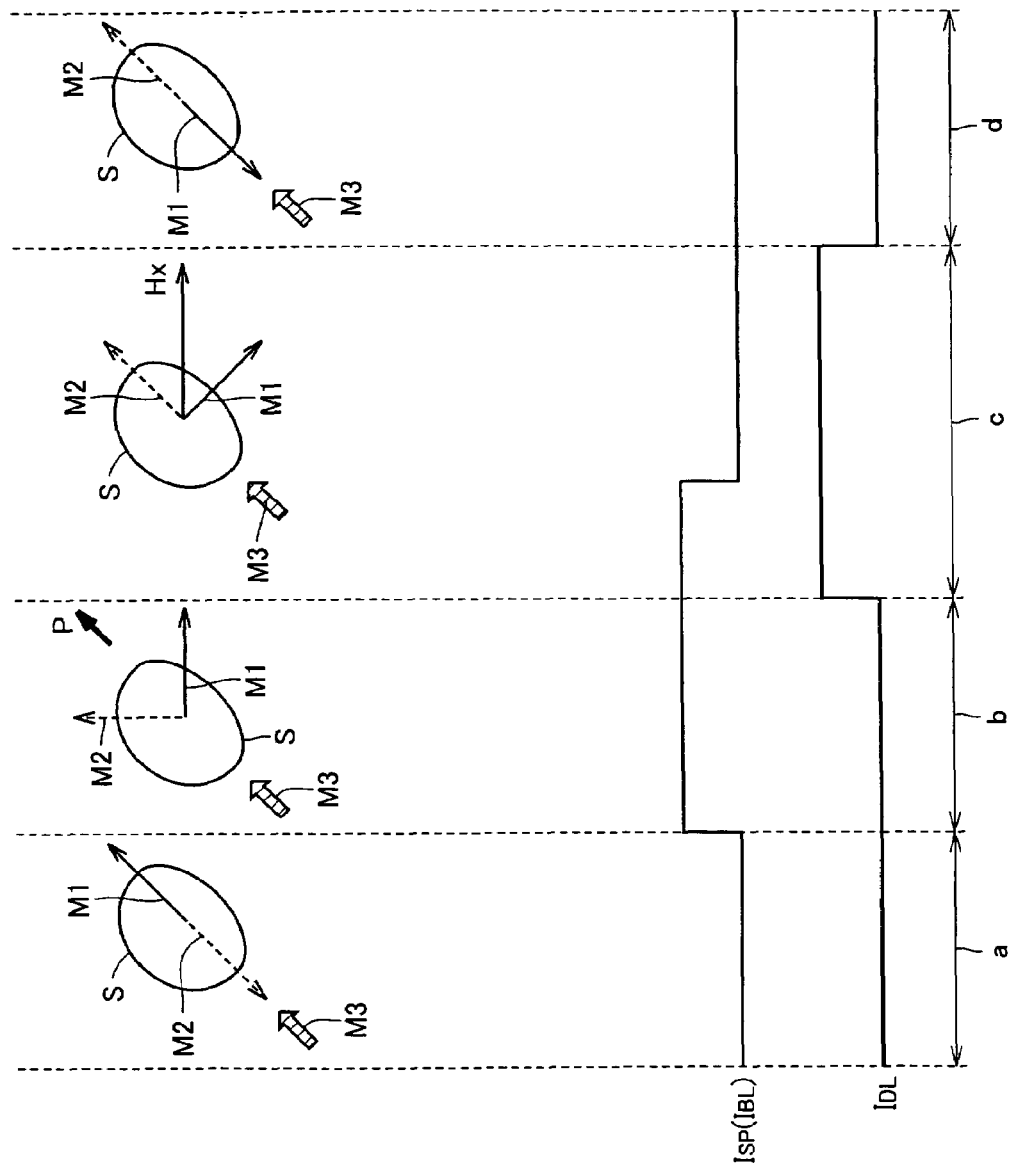
FIG. 8 illustrates data writing in a toggle manner performed by the nonvolatile semiconductor memory device according to the first embodiment of the invention.

Description will now be given on data writing in the toggle manner that is performed by the nonvolatile semiconductor memory device according to the first embodiment of the invention. FIG. 8 illustrates data writing in the toggle manner performed by the nonvolatile semiconductor memory device according to the first embodiment of the invention. FIGS. 9A-9D illustrate states of magnetization M1 of magnetic layer 101 and magnetization M2 of magnetic layer 103 according to timing a-d in FIG. 8.

Figure 9A:
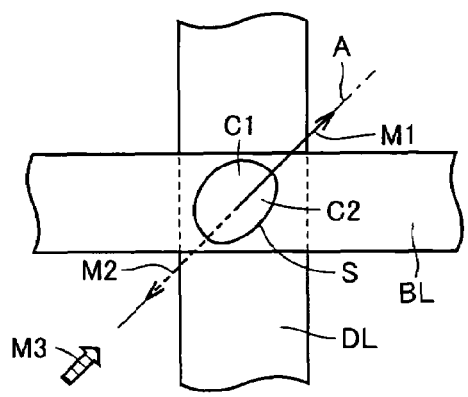
FIGS. 9A-9D illustrate states of magnetization M1 of a magnetic layer 101 and magnetization M2 of magnetic layer 103 according to timing a-d in FIG. 8.

Referring to FIGS. 8 and 9A-9D, magnetization M1 of magnetic layer 101 and magnetization M2 of magnetic layer 103 are substantially anti-parallel to each other in the normal state (timing a in FIG. 8). Each of the directions of magnetizations M1 and M2 is parallel or anti-parallel to the direction of magnetization M3 of fixed magnetic layer 105 (FIG. 9A).

Figure 9B:
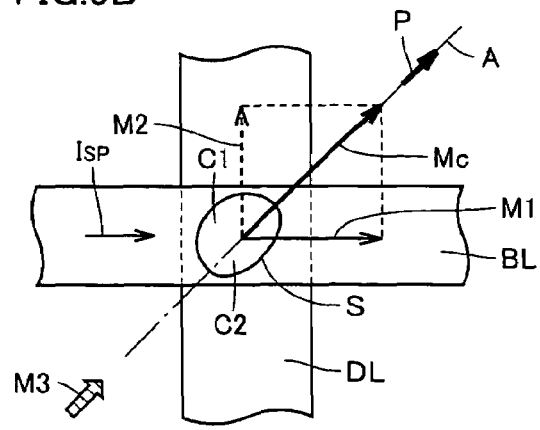

Memory cell MC of the write target is selected based on externally applied address signal AD. In the selected memory cell MC, bit line drive circuit 4 drives bit line BL to the selected state, and passes spin injection current Isp therethrough (timing b in FIG. 8). Thereby, a force (magnetic torque) P in the same direction as magnetization M3 of fixed magnetic layer 105 acts on magnetizations M1 and M2. Thereby, magnetizations M1 and M2 turn such that composite magnetization MC of magnetizations M1 and M2 may be oriented in the direction of magnetization M3 of fixed magnetic layer 105. More specifically, magnetization M2 in the direction opposite to magnetization M3 turns clockwise, i.e., toward the direction of region C1 having a high degree of magnetization turn easiness. Further, magnetization M1 turns clockwise such that composite magnetization MC of magnetizations M1 and M2 is oriented in the direction of magnetization M3 of fixed magnetic layer 105 (FIG. 9B).

Figure 9C:
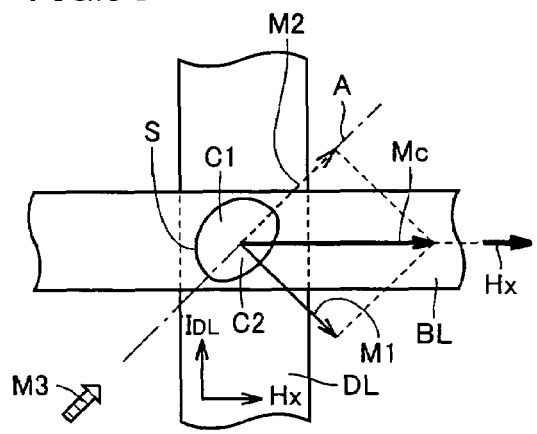

Bit line drive circuit 4 drives bit line BL to the unselected state, and stops spin injection current Isp. Also, digit line drive circuit 3 drives digit line DL to the selected state, and passes digit line current IDL (timing c in FIG. 8). Thereby, spin injection current Isp no longer produces the magnetic torque, and magnetic field Hx produced by digit line current IDL acts on magnetizations M1 and M2. Thereby, magnetizations M1 and M2 further turn clockwise so that composite magnetization MC of magnetizations M1 and M2 may be oriented in the direction of magnetic field Hx (FIG. 9C).

Bit line drive circuit 4 and digit line drive circuit 3 achieve such a situation that the time period of the state where spin injection current Isp flows overlaps with the time period of the state where digit line current IDL flows (timing c in FIG. 8). This overlapping situation is not essential, but provision of such overlapping situation can reliably prevent, e.g., such a malfunction that neither the magnetic torque generated by spin injection current Isp nor magnetic field Hx generated by digit line current IDL temporarily exists, and the direction of, e.g., magnetization M2 returns to the direction opposite to that of magnetization M3.

Then, digit line drive circuit 3 drives digit line DL to the unselected state, and stops digit line current IDL (timing d in FIG. 8). Thereby, magnetic field Hx generated by digit line current IDL no longer exists. In this state, magnetization M2 having the magnetization direction matching or substantially matching with the direction of easy axis A is stable, and thus hardly turns, and magnetization M1 of which magnetization direction is significantly different from the direction of easy axis A is instable, and thus turns toward the direction of easy axis A to a large extent. In this structure, magnetizations M1 and M2 are stable when these are anti-parallel state as already described. Therefore, magnetization M1 further turns clockwise to become anti-parallel to magnetization M2, and becomes stable in the direction opposite to magnetization M2

Figure 9D:
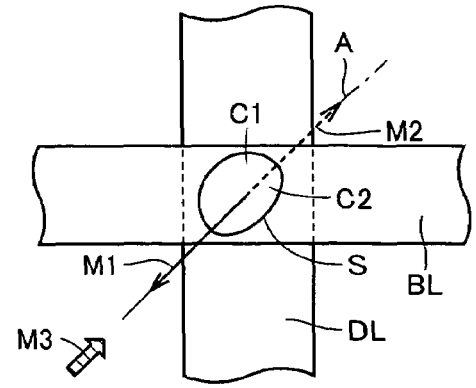

(FIG. 9D). In this manner, the directions of magnetizations M1 and M2 are inverted or toggled, and the data writing is completed.

In the toggle manner which requires generation of two magnetic fields for changing the direction of the magnetization of the magnetic layer as disclosed in U.S. Pat. No. 6,545,906 and "IEEE JOURNAL OF SOLID-STATE CIRCUITS", large quantities of currents flow through the bit and digit lines, which results in a problem that the current consumption increases in the data write operation. In the nonvolatile semiconductor memory device according to the first embodiment of the invention, however, bit line drive circuit 4 passes a spin injection current Ids from magnetic layer 101 of magnetic storing portion S to fixed magnetic layer 105 in the data write operation, and thereby a force P in the same direction as the magnetization direction of fixed magnetic layer 105 acts, instead of magnetic field Hy, on the magnetization of free magnetic layer 10. Therefore, it is not necessary to generate a strong magnetic field by increasing the quantity of current passing through bit line BL so that the current consumption can be small in the data write operation.

In the nonvolatile semiconductor memory device according to the first embodiment of the invention, control of spin injection current Isp and digit line current IDL for data writing may be performed in the manner other than that illustrated in FIG. 8. According to the current control in FIG. 8, however, the direction of magnetization M2 at timing c matches or substantially matches with the direction of easy axis A, and therefore magnetization M2 is stable. Therefore, when magnetic field Hx disappears at timing d in FIG. 8, magnetization M1 can be reliably turned to a large extent without turning magnetization M2 so that magnetizations M1 and M2 can be reliably toggled. Further, the current control illustrated in FIG. 8 is not complicated control performed, e.g., by repeating start and stop of spin and digit line currents Isp and IDL multiple times, and is simple current control. Therefore, the current consumption can be further reduced in the data write operation.

In the nonvolatile semiconductor memory device according to the first embodiment of the invention, magnetic storing portion S is cut by easy axis A into the two regions in the stacking direction of the respective layers of magnetic storing portion S, and these two regions have different degrees of magnetization turn easiness, respectively. This structure can set the turning direction of the magnetization of free magnetic layer 110 to the constant direction. More specifically, in the nonvolatile semiconductor memory device according to the first embodiment of the invention, magnetization M2 can be reliably turned clockwise at timing b illustrated in FIG. 8, and a malfunction in the data write operation can be reliably prevented.

The nonvolatile semiconductor memory device according to the first embodiment of the invention is configured to pass spin injection current Isp from magnetic layer 101 to fixed magnetic layer 105. However, the configuration is not restricted to this, and spin injection current Isp may be passed from fixed magnetic layer 105 to magnetic layer 101. In this case, electrons e having the same direction (spin) as the magnetization direction of fixed magnetic layer 105 flow from free magnetic layer 110 into fixed magnetic layer 105 so that a force in the direction opposite to the magnetization direction of fixed magnetic layer 105 can act on the magnetization of magnetic layers 101 and 103. In this case, digit line drive circuit 3 may be configured such that digit line current IDL flows oppositely to the direction shown in FIG. 2, and therefore the data writing can be performed according to the current control that is simple similarly to the current control illustrated in FIG. 8.

In the nonvolatile semiconductor memory device according to the first embodiment of the invention, the magnetization direction of fixed magnetic layer 105 is neither coincident with nor perpendicular to the direction of extension of digit line DL. Bit line drive circuit 4 and digit line drive circuit 3 pass digit line current IDL and spin injection current Isp, respectively, such that the direction in which magnetic field Hx acts on the magnetization of free magnetic layer 110 form an angle larger than 0° and smaller than 90° with respect to the direction in which the force generated by spin injection current Ids acts on the magnetization of free magnetic layer 110. This configuration can simplify the current control that is performed by bit line drive circuit 4 and digit line drive circuit 3 for toggling magnetizations M1 and M2 regardless of the direction of spin injection current Isp.

The nonvolatile semiconductor memory device according to the first embodiment of the invention is configured to pass read current IR from magnetic layer 101 to fixed magnetic layer 105. However, this configuration is not restrictive. The device may be configured to pass read current IR from magnetic layer 103 to fixed magnetic layer 105. Even in this configuration, the data reading can be performed by detecting the difference in current quantity of read current IR that is caused by the difference in electric resistance value of magnetic storing portion S.

Another embodiment of the invention will now be described with reference to the drawings. The same or corresponding portions in the figures bear the same reference numbers, and description thereof is not repeated.

Second Embodiment

A second embodiment relates to a nonvolatile semiconductor memory device in which the turning direction of free magnetic layer 110 is set to a constant direction by a method different from that in the first embodiment. Structures and operations other than those described below are substantially the same as those of the nonvolatile semiconductor memory device according to the first embodiment.

Figure 10:
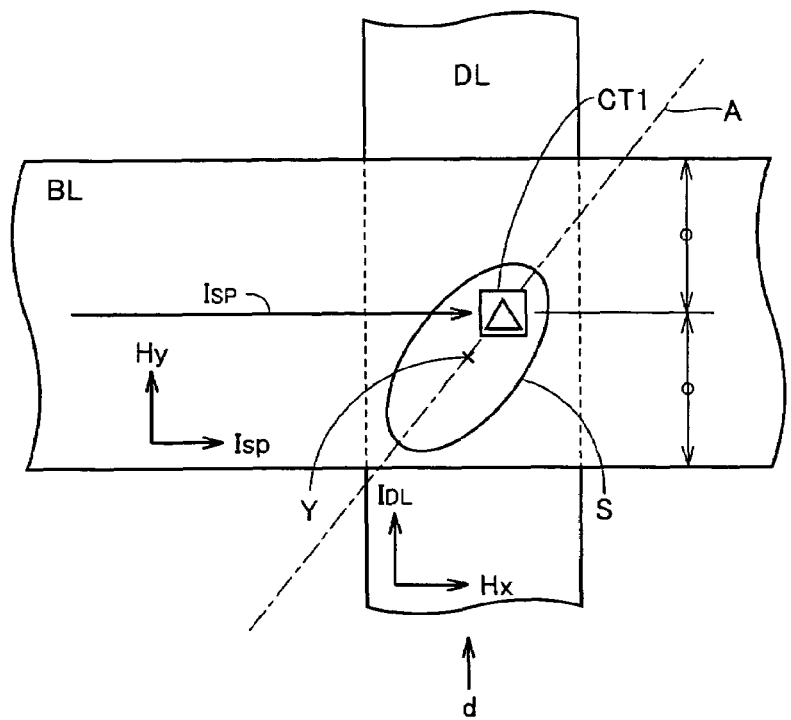
FIG. 10 is a top view of memory cell MC in FIG. 1 employed in a nonvolatile semiconductor memory device according to a second embodiment of the invention.
Figure 11:
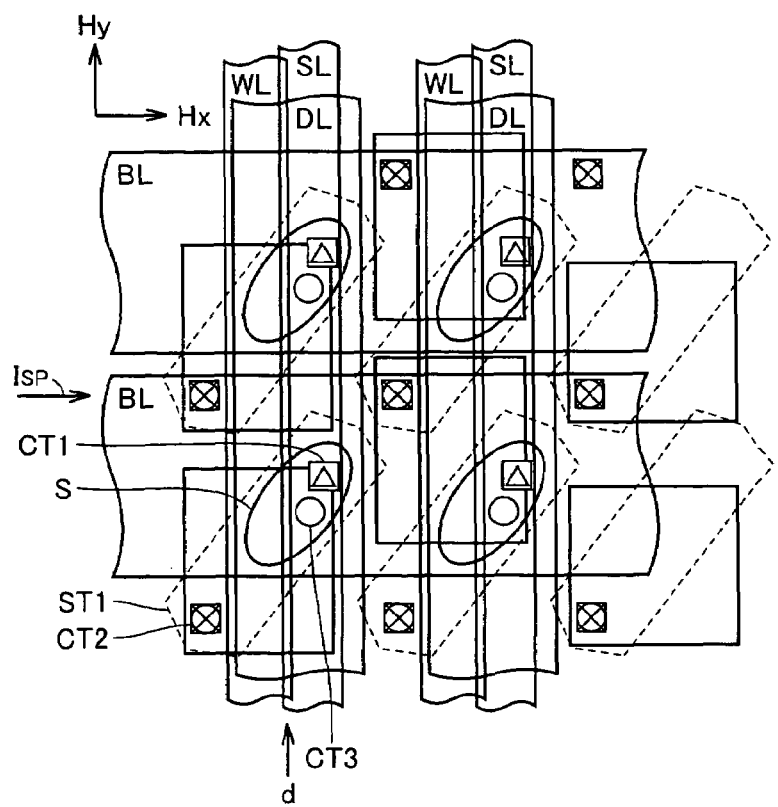
FIG. 11 is a top view of a memory cell array 1 including four memory cells MC viewed in the same direction as FIG. 10.

FIG. 10 is a top view of memory cell MC in FIG. 1 employed in the nonvolatile semiconductor memory device according to the second embodiment of the invention. FIG. 11 is a top view viewed in the same direction as FIG. 10 and showing memory cell array 1 including four memory cells MC. The structure of memory cell MC viewed in a direction d in FIGS. 10 and 11 corresponds to the structure in FIG. 5.

Magnetic storing portion S has an elliptic plane form, and easy axis A is formed in the longitudinal direction of the ellipse of the plane form.

This nonvolatile semiconductor memory device additionally uses magnetic field Hy generated by bit line current IBL, i.e., spin injection current Isp. Thus, the data writing is performed by the operation of the magnetic torque generated by magnetic fields Hx and Hy as well as spin injection current Isp.

Contact CT1 electrically connects bit line (second write current line) BL to magnetic storing portion S. Spin injection current Isp flows from bit line BL via contact CT1 to magnetic layer 101 in magnetic storing portion S.

Contact CT1 is arranged substantially at a center in the width direction of bit line BL. This structure prevents a disturbance of direction of magnetic field Hy that may be caused by deviation of an incoming path of spin injection current Isp to contact CT1, and thus prevents a malfunction in data writing using magnetic field Hy.

Contact CT1 is arranged in the path of spin injection current Isp, and particularly is located downstream from a center Y of magnetic storing portion S. When spin injection current Isp flows from magnetic storing portion S to bit line BL, contact CT1 arranged in the path of spin injection current Isp is located upstream to center Y of magnetic storing portion S. In other words, contact CT1 is arranged such that spin injection current Isp flowing on bit line BL passes above center Y of magnetic storing portion S. Owing to this structure, magnetic field Hy generated by spin injection current Isp can act over a wide range of magnetic storing portion S, and can achieve stable data writing.

Figure 12:
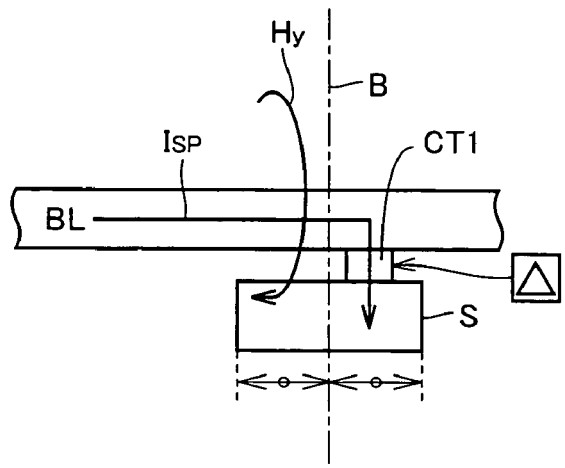
FIG. 12 illustrates a positional relationship among a bit line BL, a contact CT1 and magnetic storing portion S viewed in a direction d in FIGS. 10 and 11.

FIG. 12 illustrates a positional relationship among bit line BL, contact CT1 and magnetic storing portion S viewed in direction d in FIGS. 10 and 11, i.e., in the direction perpendicular to the extension direction of bit line BL and in a section direction of each layer of magnetic storing portion S.

Referring to FIG. 12, contact CT1 is arranged such that spin injection current Isp on bit line BL passes a center axis B in the stacking direction of magnetic storing portion S. Owing to this structure, magnetic field Hy generated by spin injection current Isp can act on a region equal to or larger than a half of magnetic storing portion S, and can achieve stable data writing.

Figure 13:
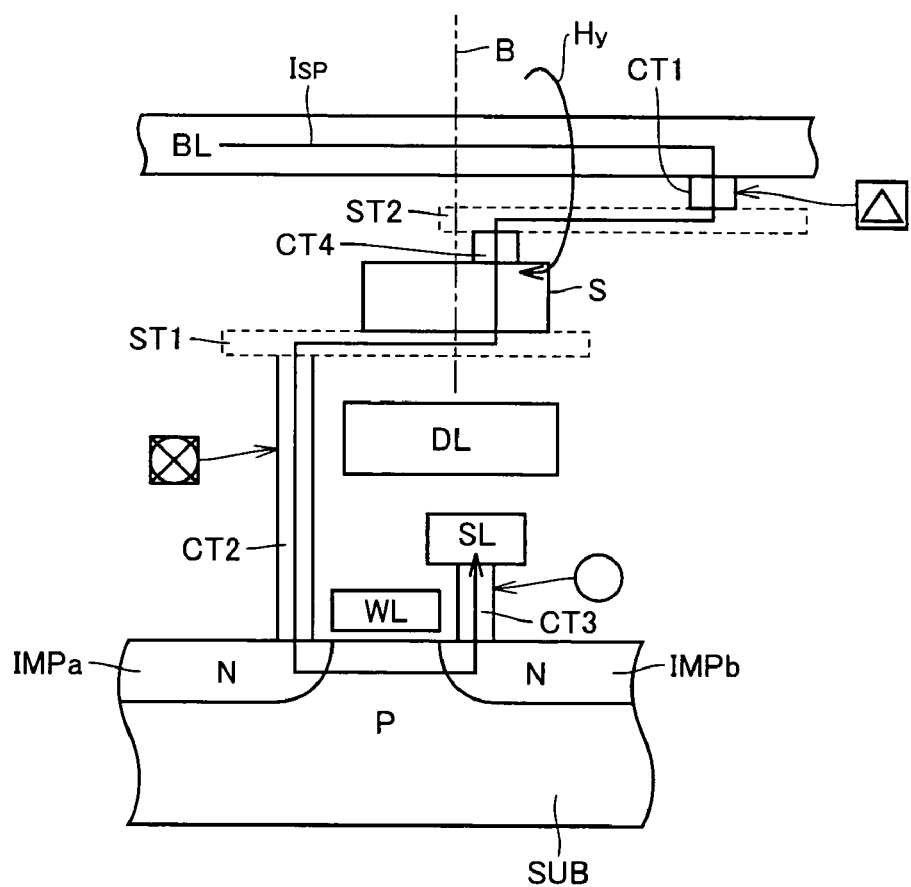
FIG. 13 schematically shows another example of a structure of memory cell MC viewed in direction d in FIGS. 10 and 11.

FIG. 13 schematically shows another example of the structure of memory cell MC viewed in direction d in FIGS. 10 and 11.

Referring to FIG. 13, memory cell MC includes a strap ST2 and a contact CT4 in addition to the structures of memory cell MC in the nonvolatile semiconductor memory device according to the first embodiment. Contact CT1 electrically connects bit line BL to strap ST2. Strap ST2 is formed of a conductive layer, and is electrically connected to magnetic storing portion S via contact CT4. Magnetic storing portion S is arranged between contact CT4 and strap ST1.

Spin injection current Isp flows from bit line BL to magnetic layer 101 in magnetic storing portion S via contact CT1, strap ST2 and contact CT4.

In stead of the structure in which bit line BL and magnetic storing portion S are electrically connected directly via the contact as shown FIG. 12, the device may employ the structure in which bit line BL and magnetic storing portion S are electrically connected via the additional strap, contact and the like as shown in FIG. 13. Even in this structure in FIG. 13, contact CT1 can be arranged such that spin injection current Isp on bit line BL passes through center axis B in the stacking direction of magnetic storing portion S when viewed in the direction perpendicular to the extension direction of bit line BL and in the section direction of each layer of magnetic storing portion S, and thereby magnetic field Hy generated by spin injection current Isp can act on a region equal to or larger than a half of magnetic storing portion S so that the stable data writing can be achieved.

Description will now be given on the data writing performed in the toggle manner by the nonvolatile semiconductor memory device according to the second embodiment of the invention.

Operations other than that at timing b in FIG. 8 are substantially the same as those of the nonvolatile semiconductor memory device according to the first embodiment of the invention, and therefore description thereof is not repeated.

Figure 14:
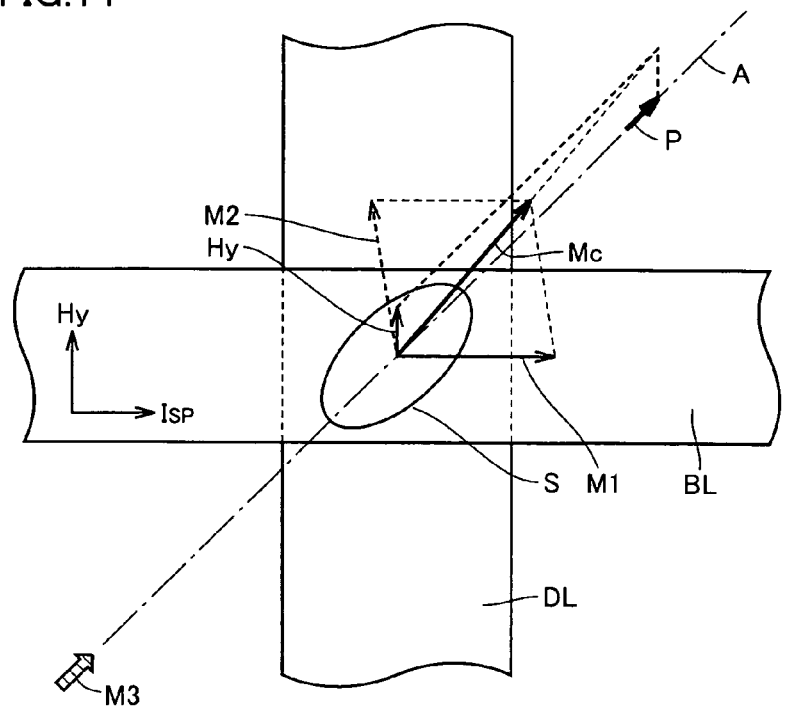
FIG. 14 shows states of magnetization M1 of magnetic layer 101 and magnetization M2 of magnetic layer 103 according to timing b in FIG. 8.

FIG. 14 shows a state of magnetization M1 of magnetic layer 101 and magnetization M2 of magnetic layer 103 at timing b in FIG. 8.

When write-target memory cell MC is selected based on externally applied address signal AD, bit line drive circuit 4 drives bit line BL to the selected state to pass spin injection current Isp in selected memory cell MC. Thereby, a force P in the same direction as magnetization M3 of fixed magnetic layer 105 acts on magnetizations M1 and M2 of magnetic layers 101 and 103. Also, magnetic field Hy generated by spin injection current Isp acts on magnetizations M1 and M2.

Thereby, magnetizations M1 and M2 turn to orient composite magnetization MC of magnetizations M1 and M2 in the same direction as the composite vector of magnetic field Hy and force P in the same direction as magnetization M3 of fixed magnetic layer 105. More specifically, magnetization M2 in the direction opposite to that of magnetization M3 first turns clockwise, i.e., in the direction of region C1 of the higher degree of magnetization turn easiness. Then, magnetization M1 turns clockwise such that composite magnetization MC of magnetizations M1 and M2 may be oriented in the same direction as the composite vector of magnetic field Hy and force P in the same direction as that of magnetization M3 of fixed magnetic layer 105.

As described above, the nonvolatile semiconductor memory device according to the second embodiment of the invention can set the turning direction of the magnetization of free magnetic layer 110 to the constant direction, similarly to the nonvolatile semiconductor memory device according to the first embodiment. More specifically, magnetization M2 can be reliably turned clockwise at timing b illustrated in FIG. 8, and thereby the malfunction in the data write operation can be reliably prevented. Therefore, the nonvolatile semiconductor memory device according to the second embodiment of the invention can simplify the form of magnetic storing portion S as compared with the nonvolatile semiconductor memory device according to the first embodiment, and the manufacturing cost of the nonvolatile semiconductor memory device can be reduced.

Still another embodiment of the invention will now be described with reference to the drawings. In the figures, the same or corresponding portions bear the same reference numbers, and description thereof is not repeated.

Third Embodiment

A third embodiment relates to a nonvolatile semiconductor memory device in which the directions of spin injection current Isp and read current IR are opposite to those already described. Structures and operations other than those described below are substantially the same as those of the nonvolatile semiconductor memory device according to the first embodiment.

Figure 15:
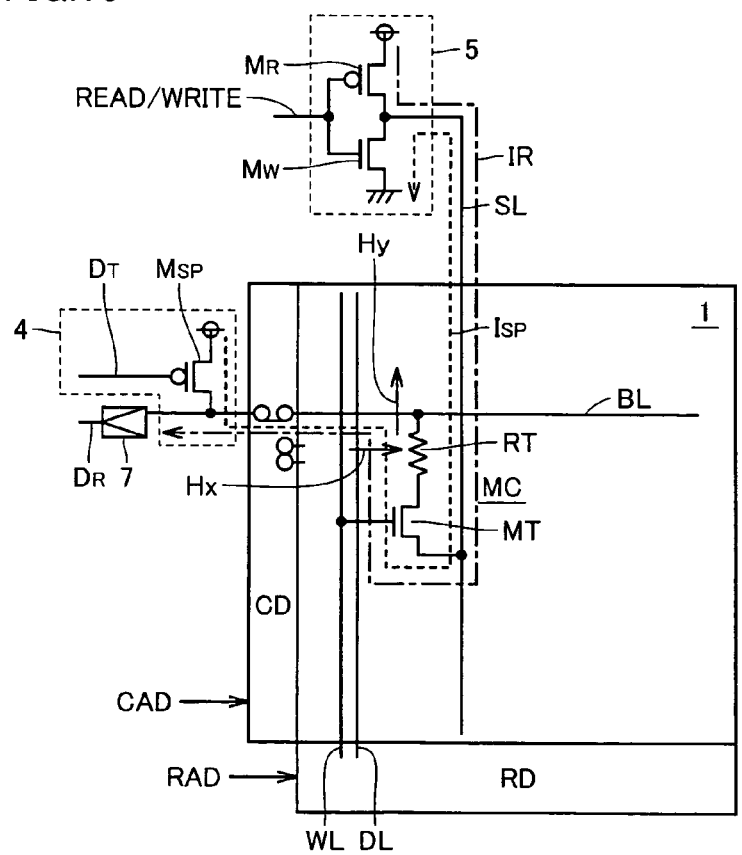
FIG. 15 illustrates directions of a spin injection current Isp and a read current IR in a nonvolatile semiconductor memory device according to a third embodiment of the invention.

FIG. 15 illustrates directions of spin injection current Isp and read current IR in the nonvolatile semiconductor memory device according to the third embodiment of the invention.

Referring to FIG. 15, bit line drive circuit 4 includes a P-channel MOS transistor Msp. Source line drive circuit 5 includes a P-channel MOS transistor MR and an N-channel MOS transistor MW. A column decoder CD is included in bit line drive circuit 4, read select circuit 6 and the like, and selects bit line BL corresponding to the row indicated by internal row address signal CAD. A row decoder RD is included in word line drive circuit 2, digit line drive circuit 3 and the like, and selects word line WL and digit line DL corresponding to the column indicated by internal column address signal RAD.

First, description will be given on the operation of passing spin injection current Isp through memory cell MC in the data write operation of the nonvolatile semiconductor memory device.

Bit line drive circuit 4 produces toggle data DT based on internal write data Din, and provides it to a gate of P-channel MOS transistor Msp. More specifically, when it is necessary to change the logical level of data stored in memory cell MC, bit line drive circuit 4 sets toggle data DT to the L-level, and thereby turns on P-channel MOS transistor Msp. When it is not necessary to change the logical level of data stored in memory cell MC, bit line drive circuit 4 sets toggle data DT to the H-level, and thereby turns off P-channel MOS transistor Msp.

P-channel MOS transistor Msp changes between the on- and off states based on toggle data DT. Source line drive circuit 5 receives write activating signal WRITE from control circuit 10, turns off P-channel MOS transistor MR and turns on N-channel MOS transistor MW. When P-channel MOS transistor Msp is turned on and N-channel MOS transistor MW is turned on, spin injection current Isp flows from selected bit line BL to source line SL, and further flows into N-channel MOS transistor MW in the on state.

Then, description will be given on the operations performed when the nonvolatile semiconductor memory device passes read current IR to memory cell MC in the data read operation.

Source line drive circuit 5 receives read activating signal READ from control circuit 10, turns on P-channel MOS transistor MR and turns off N-channel MOS transistor MW. Bit line drive circuit 4 receives read activating signal READ from control circuit 10, and turns off P-channel MOS transistor Msp. Thereby, read current IR flows from P-channel MOS transistor MR to source line SL and selected bit line BL. Read circuit 7 detects the quantity of read current IR flowing through bit line BL, and produces the internal read data.

In the nonvolatile semiconductor memory device according to the third embodiment of the invention, as described above, bit and source line drive circuits 4 and 5 pass read current IR through magnetic storing portion S in the direction opposite to spin injection current Isp. This configuration can prevent such a situation that magnetizations M1 and M2 of magnetic layers 101 and 103 erroneously turn to change the storage contents of magnetic storing portion S during the data read operation.

In the nonvolatile semiconductor memory device according to the third embodiment of the invention, bit and source line drive circuits 4 and 5 pass spin injection current Isp from bit line BL toward source line SL, i.e., from magnetic layer 101 to fixed magnetic layer 105. In general, when the spin injection current flows in the above direction, a smaller quantity of current can exert the magnetic torque on the magnetization of free magnetic layer 110 as compared with the case where the spin injection current flows from fixed magnetic layer 105 to magnetic layer 101. Thus, the data can be written more readily when spin injection current Isp flows from bit line BL to source line SL. Therefore, the device passes spin injection current Isp in the direction facilitating the data writing, and also passes read current IR in the direction relatively suppressing data writing, i.e., in the direction from source line SL to bit line BL, whereby the current consumption in the data write operation is reduced, and it is possible to prevent more reliably the erroneous turn of magnetizations M1 and M2 of magnetic layers 101 and 103 in the data read operation.

Yet another embodiment of the invention will now be described with reference to the drawings. In the figures, the same or corresponding portions bear the same reference numbers, and description thereof is not repeated.

Fourth Embodiment

A fourth embodiment relates to a nonvolatile semiconductor memory device in which the structures of magnetic storing portion S are changed. Structures and operations other than those described below are substantially the same as those of the nonvolatile semiconductor memory device according to the first embodiment.

Figure 16:
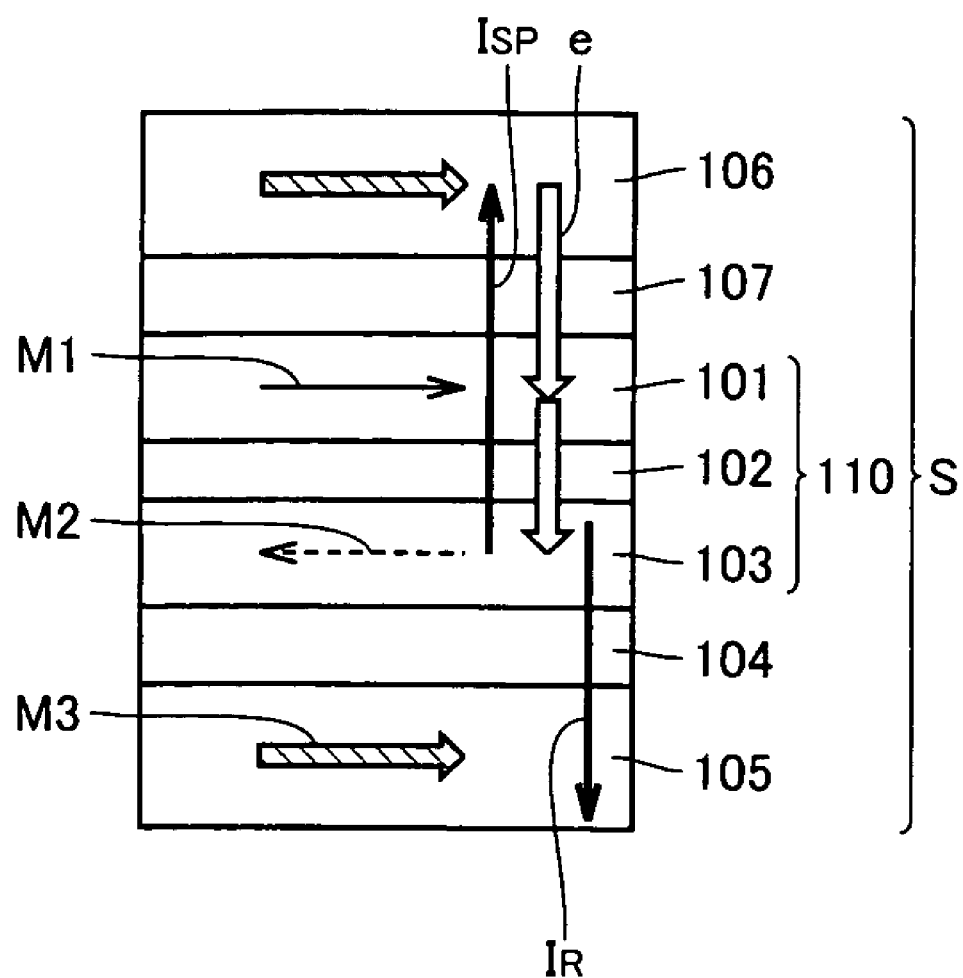
FIG. 16 is a cross section of magnetic storing portion S in a nonvolatile semiconductor memory device according to a fourth embodiment of the invention taken along line IV-IV in FIG. 2.

FIG. 16 is a cross section of magnetic storing portion S in a nonvolatile semiconductor memory device according to the fourth embodiment of the invention taken along line IV-IV in FIG. 2.

Magnetic storing portion S includes a fixed magnetic layer (second fixed magnetic layer) 106 and a nonmagnetic layer (third nonmagnetic layer) 107 in addition to the structures of magnetic storing portion S in the nonvolatile semiconductor memory device according to the first embodiment. Nonmagnetic layer 107 of magnetic storing portion S may be an insulating nonmagnetic layer, and may also be a conductive nonmagnetic layer.

Fixed layer 106 has a fixed magnetization direction. The magnetization direction of fixed magnetic layer 106 is the same as that of fixed magnetic layer 105. Nonmagnetic layer 107 is formed between magnetic layer 101 and fixed magnetic layer 106.

In the data write operation, bit line drive circuit 4 passes spin injection current Isp from magnetic layer 103 to fixed magnetic layer 106, and thereby exerts a force in the same direction as the magnetization direction of fixed magnetic layer 106 on the magnetizations of magnetic layers 101 and 103. In the data read operation, read circuit 7 passes read current IR from magnetic layer 103 to fixed magnetic layer 105.

The structure described above optimizes nonmagnetic layer 107 and fixed magnetic layer 106 for dedication to the data writing. More specifically, the materials and film thicknesses of nonmagnetic layer 107 and fixed magnetic layer 106 are selected to minimize the current quantity of spin injection current Isp, and thereby the current consumption of the nonvolatile semiconductor memory device in the data write operation can be reduced. Further, tunneling layer 104 and fixed magnetic layer 105 are optimized for dedication to the data reading. More specifically, the materials and film thicknesses of tunneling layer 104 and fixed magnetic layer 105 are selected to maximize the read current difference caused by difference in logical level of the data stored in magnetic storing portion S, and thereby the data read error can be reliably prevented.

By orienting the magnetizations of fixed magnetic layers 105 and 106 in the same direction, it is possible in the manufacturing steps of magnetic storing portion S to employ the magnetic fields in the same direction for magnetizing these fixed magnetic layers so that the manufacturing steps of the nonvolatile semiconductor memory device can be simplified.

In magnetic storing portion S, the layers for passing spin injection current Isp and read current IR are not restricted to the configuration shown in FIG. 16, and such a structure may be employed that the layers passing spin injection current Isp and read current IR may be vertically inverted with respect to free magnetic layer 110. Thus, such a structure may be employed that bit line drive circuit 4 passes spin injection current Isp from magnetic layer 101 to fixed magnetic layer 105 in the data write operation, and read circuit 7 passes read current IR from magnetic layer 101 to fixed magnetic layer 106 in the data read operation.

The direction of spin injection current Isp may be configured such that spin injection current Isp flows from fixed magnetic layer 106 to magnetic layer 103. Also, such a structure may be employed that read current IR flows from fixed magnetic layer 105 to magnetic layer 103.

In this nonvolatile semiconductor memory device, a minimum range is set in magnetic storing portion S for passing spin injection current Isp and read current IR therethrough. However, the range for passing spin injection current Isp and read current IR may be located between fixed magnetic layers 105 and 106, whereby electrodes for taking out the respective currents can be readily arranged, and the manufacturing cost of the nonvolatile semiconductor memory device can be reduced.

Further, in the nonvolatile semiconductor memory device according to the first to fourth embodiments of the invention, tunneling layer 104 is an insulating layer, i.e., insulating nonmagnetic layer, but this structure is not restrictive. Tunneling layer 104 may be a conductive nonmagnetic layer. However, the structure having tunneling layer 104 formed of an insulating layer is preferable because it can maximize the read current difference caused by the difference in logical level of the data stored in magnetic storing portion S, as compared with the case where tunneling layer 104 is a conductive nonmagnetic layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a magnetic storing portion having an electric resistance value variable depending on storage data,
   said magnetic storing portion including:
   a free magnetic layer having first and second magnetic layers magnetized oppositely to each other, and also having a first nonmagnetic layer formed between said first and second magnetic layers,
   a first fixed magnetic layer having a fixed magnetization direction, and
   a second nonmagnetic layer formed between said second magnetic layer and said first fixed magnetic layer;
   said nonvolatile semiconductor memory device further comprises:
   a first drive circuit passing a write current through a first write current line in a data write operation, and thereby generating a data write magnetic field acting on magnetization of said free magnetic layer; and
   a second drive circuit passing a spin injection current between said first magnetic layer and said first fixed magnetic layer of said magnetic storing portion in a data write operation, and thereby exerting a force in the same direction as or in the direction opposite to the magnetization direction of said first fixed magnetic layer on the magnetization of said free magnetic layer.

2. The nonvolatile semiconductor memory device according to claim 1, wherein
   degrees of magnetization turn easiness of two regions in said magnetic storing portion cut in a stacking direction of said respective layers by an easy axis are different from each other.

3. The nonvolatile semiconductor memory device according to claim 1, wherein
   said first drive circuit operates in the data write operation to pass said write current after said second drive circuit passes said spin injection current, and to stop said write current after said second drive circuit stops said spin injection current.

4. The nonvolatile semiconductor memory device according to claim 1, wherein
   the magnetization direction of said first fixed magnetic layer is neither coincident with nor perpendicular to the direction of extension of said first write current line, and
   said first and second drive circuits pass said write current and said spin injection current such that an angle larger than 0° and smaller than 90° is formed between the direction of action of said data write magnetic field on magnetization of said free magnetic layer and the direction of action of a force caused by said spin injection current on magnetization of said free magnetic layer.

5. The nonvolatile semiconductor memory device according to claim 1, wherein
   said second drive circuit operates in the data write operation to pass said spin injection current and thereby to generate further a magnetic field setting a turning direction of magnetization of said free magnetic layer to a constant direction.

6. The nonvolatile semiconductor memory device according to claim 5, wherein
   said second drive circuit operates, in the data write operation, to pass said spin injection current to a second write current line arranged in a direction not coincident with a direction of extension of said first write current line, and
   said nonvolatile semiconductor memory device further comprises:
   a contact electrically connecting said second write current line and said magnetic storing portion, and being arranged such that said spin injection current in said second write current line passes through a center axis in a stacking direction of said magnetic storing portion when viewed in a direction perpendicular to the extension direction of said second write current line and in a section direction of each of said stacked layers.

7. The nonvolatile semiconductor memory device according to claim 1, wherein
   said second drive circuit operates in a data read operation to pass a read current between said second magnetic layer and said first fixed magnetic layer of said magnetic storing portion in a direction opposite to said spin injection current.

8. The nonvolatile semiconductor memory device according to claim 1, wherein
   said magnetic storing portion further includes:
   a second fixed magnetic layer having a fixed magnetization direction, and
   a third nonmagnetic layer formed between said first magnetic layer and said second fixed magnetic layer; and
   said second drive circuit further passes a read current between said first magnetic layer and said second fixed magnetic layer in a data read operation.

9. The nonvolatile semiconductor memory device according to claim 8, wherein
   the magnetization direction of said second fixed magnetic layer is the same as the magnetization direction of said first fixed magnetic layer.

* * * * *